US008564467B2

(12) United States Patent
Yang et al.

(10) Patent No.: US 8,564,467 B2

(45) Date of Patent: Oct. 22, 2013

(54) GENERATING AN ADJUSTABLE SIGNAL

(75) Inventors: Pei Yang, Beijing (CN); Rongrong Bai, Beijing (CN); Jianting Wang, Beijing (CN); Yaoli Jiang, Beijing (CN); Dianyu Chen, Beijing (CN); Yan Qi, Beijing (CN); Rui Wang, Beijing (CN); Zhen Li, Beijing (CN); Shizhu Chen, Beijing (CN); Xiuli Feng, Beijing (CN); Bo Tang, Beijing (CN); Zhongzhi Liu, Beijing (CN); Haiqing Lin, Ladera Ranch, CA (US); Yihai Xiang, Rancho Santa Margarita, CA (US)

(73) Assignee: Beijing KT Micro, Ltd., Beijing (CN)

( * ) Notice: Subject to any disclaimer, the term of this patent is extended or adjusted under 35 U.S.C. 154(b) by 68 days.

(21) Appl. No.: 13/250,431

(22) Filed: Sep. 30, 2011

(65) Prior Publication Data

US 2012/0127008 A1 May 24, 2012

(30) Foreign Application Priority Data

Nov. 22, 2010 (CN) .......................... 2010 1 0556202

(51) Int. Cl.
*H03M 3/00* (2006.01)

(52) U.S. Cl.
USPC .......................................... 341/143; 375/376

(58) Field of Classification Search
USPC ........... 341/143, 155, 118, 131, 126; 375/376
See application file for complete search history.

(56) References Cited

U.S. PATENT DOCUMENTS 6,515,553 B1 * 2/2003 Filiol et al. .................... 332/127
8,019,035 B2 * 9/2011 Norsworthy et al. ......... 375/372

* cited by examiner

*Primary Examiner* — Joseph Lauture
(74) *Attorney, Agent, or Firm* — J.C. Patents

(57) ABSTRACT

A method and device for generating an adjustable signal includes a voltage generator configured to continuously adjust an output voltage and output the voltage, a ΣΔ modulator configured to output a digital signal of pre-determined-cycle based on the output voltage and a reference voltage, a counter configured to count the number of a target level in the digital signal of a pre-determined number of cycles, and a digital signal generator configured to generate a target signal based on the number of the target level. The method and device may improve the accuracy of the generated signal while remaining the same feel of continuous adjustment.

16 Claims, 5 Drawing Sheets

GENERATING AN ADJUSTABLE SIGNAL

RELATED APPLICATIONS INFORMATION

The application claims priority under 35 U.S.C. 119(a) to Chinese application number 201010556202.6, filed on Nov. 22, 2010, which is incorporated herein by reference in its entirety as if set forth in full.

BACKGROUND

1. Technical Field

The embodiments described herein relate to microelectronics, and more particularly, to an adjustable signal generating device and related method for generating the adjustable signal.

2. Related Art

FIG. 1 is a schematic diagram showing a superheterodyne receiver under the existing technologies. The superheterodyne receive may include the following: an input circuit 100, a high-frequency amplifier 101, a mixer 102, a local oscillator 103, an intermediate frequency amplifier 104, an amplitude limiter 105, a frequency discriminator 106, a low frequency amplifier 107. In the superheterodyne receiver, because different channels corresponds to different receiving frequencies, the local oscillator 103 needs to be adjusted to generate different oscillation frequencies. FIG. 2 is a circuit diagram showing a local oscillator under the existing technologies. The LC oscillator is usually used for the local oscillator and the LC oscillator includes a capacitor 20 and an inductor 21, the capacitor 20 includes a variable capacitor 201 and a fixed capacitor 202. The user may change the capacitance of the variable capacitor 201 by turning the knob continuously, thus changing the local oscillator frequency of the local oscillator. Because the nature is an analog world, a continuous adjustment method would make the user experience much better.

However, these aforementioned analog regulation method relies mainly on the absolute value of the variable capacitor 201 to determine the oscillation frequency, in the production process, there is a need to fine tune the absolute value of the variable capacitor 201 manually, making the absolute frequency accuracy of generated local oscillator signal low. The problem of low accuracy for signals generated under continuous adjustment method also exists in some other adjustable signal circuits including an amplitude adjustment circuit.

SUMMARY

An adjustable signal generating device and related method for generating the adjustable signal are described herein and the described method and device improve the accuracy of the generated signal while remaining the same feel of continuous adjustment.

In one aspect, an adjustable signal generating device includes: a voltage generator configured to continuously adjust an output voltage and output the voltage; a ΣΔ modulator configured to output a digital signal of pre-determined-cycle based on the output voltage and a reference voltage; a counter configured to count the number of a target level in the digital signal of a pre-determined number of cycles; and a digital signal generator configured to generate a target signal based on the number of the target level.

In another aspect, a method for generating an adjustable signal by an adjustable signal generating device includes: continuously adjusting an output voltage and outputting the output voltage by a voltage generator; outputting a digital signal of a pre-determined number of cycles based on the output voltage and a reference voltage by a ΣΔ modulator; counting the number of a target level in the digital signal of the pre-determined number of cycles by a counter; and generating a target signal based on the number of the target level by a digital signal generator.

The voltage generator adjusts the output voltage continuously, thus maintaining a continuous adjustment method. In addition, the target signal is generated by a digital signal generator, thus avoiding the manual fine-tuning. Because the digital signal generator has high precision, accuracy of the generated target signal is improved.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
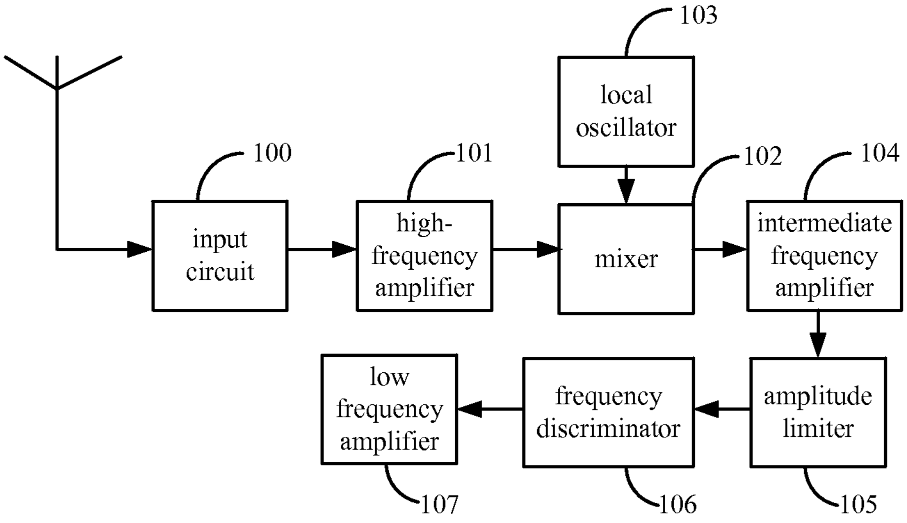
FIG. 1 (PRIOR ART)
FIG. 1 is schematic diagram showing a superheterodyne receiver under the existing technologies.
Figure 2:
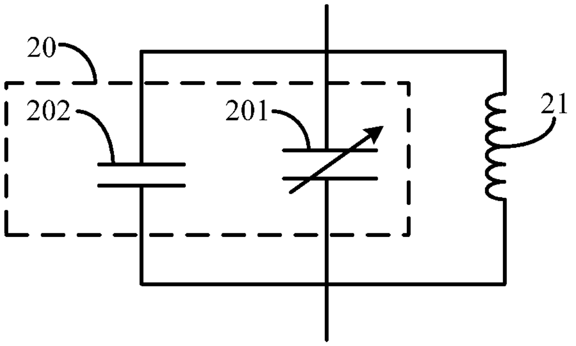
FIG. 2 (PRIOR ART)
FIG. 2 is a circuit diagram for a local oscillator under the existing technologies.

Referring now to the drawings, a description will be made herein of embodiments herein.

Figure 3:
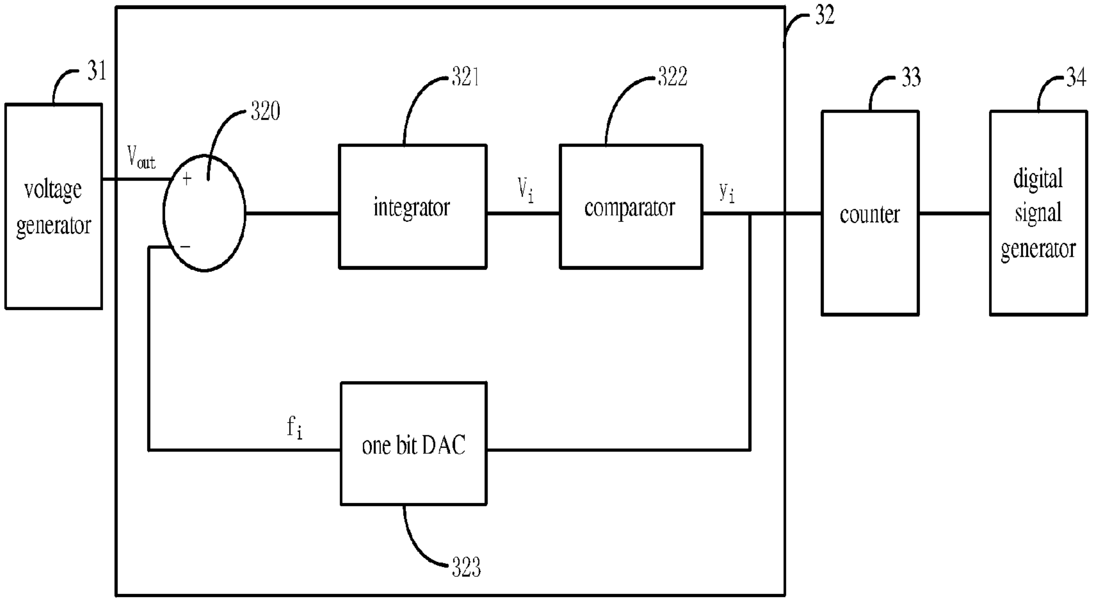
FIG. 3 a schematic diagram showing an adjustable signal generating device according to a first embodiment.

FIG. 3 a schematic diagram showing an adjustable signal generating device according to a first embodiment. The adjustable signal generating device may include a voltage generator 31, a ΣΔ modulator 32, a counter 33 and a digital signal generator 34. More specifically, the ΣΔ modulator 32 may be configured to connect to the voltage generator 31, the counter 33 may be configured to connect to the ΣΔ modulator 32, and the digital signal generator 34 may be configured to connect to the counter 33.

The voltage generator may be configured to continuously adjust an output voltage and output the output voltage. More specifically, the user may continuously adjust a knob to achieve the continuous tuning. The ΣΔ modulator 32 may be configured to output a digital signal of pre-determined number of cycles based on the output voltage and a reference voltage. In particular, the pre-determined number of cycles=the possible number of target signal−1, the possible number of target signals is not limited to the power of 2. The counter 33 may be configured to count the number of target level in the digital signal of a pre-determined number of cycles. The digital signal generator 34 may be configured to generate a target signal based on the number of the target level. More specifically, the voltage generator 31 may be a potentiometer connected between the power supply and the ground, or be configured by a current source and a variable resistor in series. The ΣΔ modulator 32 may be a first order or higher-order ΣΔ modulator, when requirement for the conversion speed is high, a high order ΣΔ modulator may be used. The digital signal generator 34 may be a digital oscillator, a digital audio signal generator.

As illustrated in FIG. 3, the ΣΔ modulator 32 may include a feedback loop formed by a differentiator 320, an integrator 321, a comparator 322 and a one bit DAC 32. For the $i_{th}$ cycle in m pre-determined cycles of the ΣΔ modulator, i is a natural number greater than or equal to one, one input for the differentiator 320 may be the output voltage $V_{out}$ of the voltage generator 31, another input for the differentiator 320 may be the output $f_i$ of the one bit DAC 323, the differential device 320 may send its output to the integrator 321, the integrator 321 may output V based on the following formula: $V_i=V_{out}-f_{i-1}+V_{i-1}$, in which, $V_0=0$, $f_0=0$, the integrator 321 may output $V_i$ to the comparator 322, if $V_i$ is greater than 0, the comparator 322 may output $y_i$ as high level "1", if $V_i$ is less than or equal to 0, the comparator 322 may output $y_i$ as low level "0", the output $y_i$ of the comparator 322 may be the output of the ΣΔ modulator 32, at the same time, the comparator 322 may send its output f to the one bit DAC 323 according to the following formula:

$$f_i = \begin{cases} V_{ref}, & y_i = 1 \\ 0, & y_i = 0 \end{cases} \tag{1}$$

In particular, $V_{ref}$ is a reference voltage, the output voltage $V_{out}$ of the voltage generator 31 and the number (n) of the high level "1" generated by the comparator 322 satisfy the following relationship:

$$\frac{V_{out}}{V_{ref}} = \frac{n+\varepsilon}{m} \tag{2}$$

In particular, $\epsilon \in [0, 1]$ or $[-1, 0]$.

As illustrated in Table 1, Table 1 is an output table of the comparator in the adjustable signal generating device according to a first embodiment. Assuming that m=8, $V_{ref}$=8V, $V_{out}$=3V, as indicated in Table 1, when $V_{out}$=3V, the comparator 322 may generate three "1" in eight pre-determined cycles. When $V_{out}$=7V, the comparator 322 may produce seven "1" in eight pre-determined cycles.

TABLE 1

| $V_{out}$ | i | 1 | 2 | 3 | 4 | 5 | 6 | 7 | 8 |
|---|---|---|---|---|---|---|---|---|---|
| 3 | $V_i$ | 3 | −2 | 1 | −4 | −1 | 2 | −3 | 0 |
| | $y_i$ | 1 | 0 | 1 | 0 | 0 | 1 | 0 | 0 |
| | $f_i$ | 8 | 0 | 8 | 0 | 0 | 8 | 0 | 0 |
| 7 | $V_i$ | 7 | 6 | 5 | 4 | 3 | 2 | 1 | 0 |
| | $y_i$ | 1 | 1 | 1 | 1 | 1 | 1 | 1 | 0 |
| | $f_i$ | 8 | 8 | 8 | 8 | 8 | 8 | 8 | 0 |

As further illustrated in Table 1, the reference voltage may be divided evenly into m parts, each part corresponds to an output voltage $V_{out}$ interval, and each output voltage $V_{out}$ interval corresponds to a target signal, In other words, each target signal corresponds to an output voltage $V_{out}$ interval with the same length. As a result, if the generated signal is marked on a tuning dial and the marks correspond to the output voltage $V_{out}$ then each target signal may be evenly marked on the calibration plate.

Figure 4:
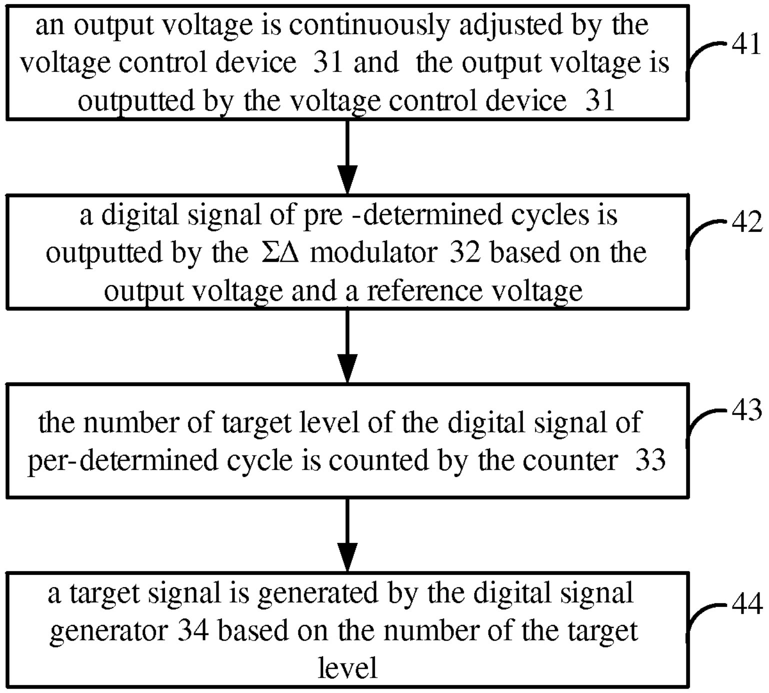
FIG. 4 is a flow chart showing a method for generating an adjustable signal by the adjustable signal generating device in FIG. 3.

FIG. 4 is a flow chart showing a method for generating an adjustable signal by the adjustable signal generating device in FIG. 3. The method may include the following:

In step 41, an output voltage is continuously adjusted by the voltage control device 31 and the output voltage is outputted by the voltage control device 31;

In step 42, a digital signal of pre-determined cycles is outputted by the ΣΔ modulator 32 based on the output voltage and a reference voltage;

In step 43, the number of target level of the digital signal of per-determined cycle is counted by the counter 33;

In step 44, a target signal is generated by the digital signal generator 34 based on the number of the target level.

In this embodiment, the voltage generator 31 may continuously adjust the output voltage, thus maintaining a continuous adjustment state. In addition, the digital signal generator 34 may generate the target signal to avoid the manual fine-tuning, because of the high precision of the digital signal generator, the accuracy of the generated signal is improved.

Figure 5:
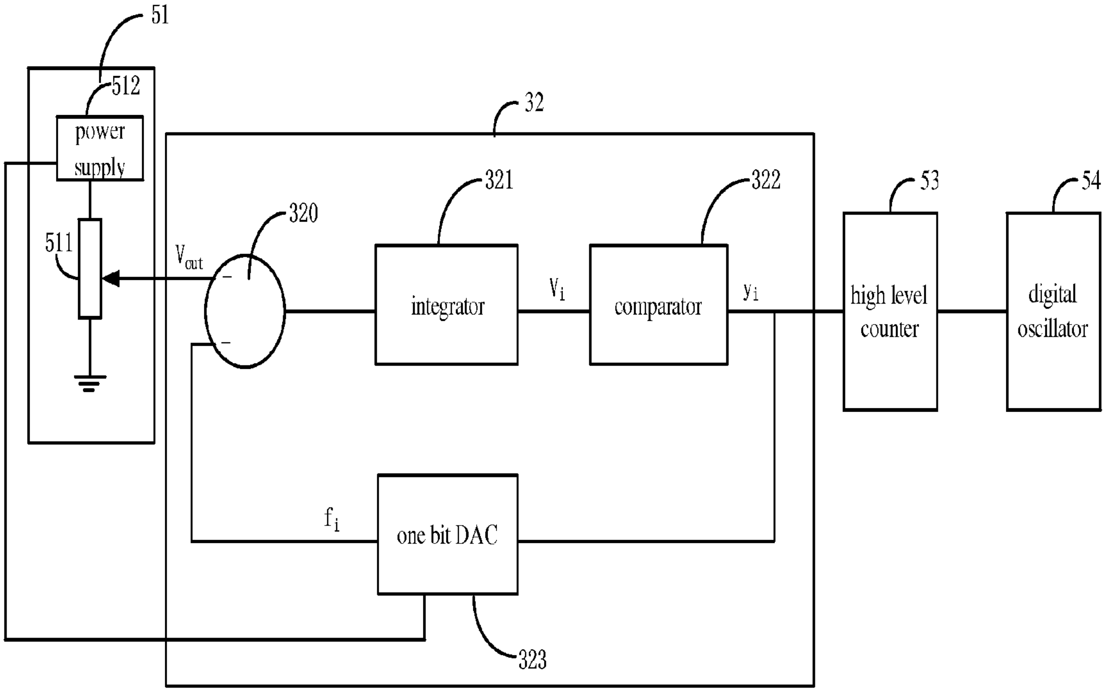
FIG. 5 is a schematic diagram showing an adjustable signal generating device according to a second embodiment.

FIG. 5 is a schematic diagram showing an adjustable signal generating device according to a second embodiment. The difference between the present embodiment and previous one is that the voltage generator 31 may specifically be a potentiometer 51, and the potentiometer 51 may include a resistor 511 and a power supply 512, the output voltage $V_{out}$ is the following:

$$V_{out} = \frac{R_{out}}{R} V_{DD} \tag{3}$$

$$V_{DD} = V_{ref} \tag{4}$$

In particular, R is the resistance of the resistor 511, $R_{out}$ is the resistance of the tap and is defined as output resistance $R_{out}$ in this embodiment. $V_{DD}$ is the voltage of the power supply 512 and the $V_{DD}$ may be outputted to the one bit DAC 323 as the reference voltage. If the power supply voltage $V_{DD}$ is fixed, the output voltage $V_{out}$ is only related to the ratio between the output resistance $R_{out}$ and the resistance R of the resistor 511, and is not related to the resistance R of the resistor 511. As a result, even if the resistance R of the resistor 511 is not very accurate, the accuracy of the digital signal generator would not be affected.

In order to protect the potentiometer 51, a mechanical limit device may be installed in the resistor 511, and the output voltage $V_{out}$ of the potentiometer 51 would not reach the maximum value $V_{DD}$ and the minimum value 0. The pre-determined number of cycles may include a first protection range, an effective range, and a second protection range, the upper limit of the first protection range is less than the lower limit of the effective range, the upper limit of the effective range is less than or equal to the lower limit of the second protection range, the number of the target level is within the effective range. For example: the pre-determined number of cycles is 169, [0, 9] is the first protection range, [10, 159] is the effective range, [160, 169] is the second protection range. In one embodiment, the pre-determined number of cycles may only include a first protection range and an effective range. Alternatively, the pre-determined number of cycles may also only include an effective range and a second protection range. For example, the per-determined number of cycles is 169, [0, 9] is the first protection range, [10, 169] is the effective range.

Furthermore, from (2) and (3), the following formula may be deduced:

$$\frac{V_{out}}{V_{DD}} = \frac{R_{out}}{R} = \frac{n+\varepsilon}{m} \tag{5}$$

As shown by formula (5), when the resistance of resistor 511 and the output resistance $R_{out}$ are fixed, if the power supply voltage $V_{DD}$ varies, the output voltage $V_{out}$ would track with the variation of the power supply voltage. However, since the ratio between the output voltage $V_{out}$ and the power supply voltage $V_{DD}$ is constant, the number of high signal level counted by the counter 33 would not change, thus the device is not sensitive to the variation of the power supply voltage.

In this embodiment, the counter 33 may be a high level counter 53, the digital signal generator 34 may be a digital oscillator 54. The high level counter 53 may be configured to count the number of high level in the pre-determined number of cycles of the digital signal. The pre-determined number of cycles may be determined based on the actual circumstances, for example: when the digital oscillator 54 needs to generate 150 oscillation signals of different frequencies, then the pre-determined number of cycles may be 149, the number of high level may be 0-149; if the digital oscillator 54 needs to generate 220 oscillation signals of different frequencies, then the per-determined number of cycles may be 219, the number of high level may be 0-219. The digital oscillator 54 may be configured to obtain the frequency of the oscillation signal based on the number of target level, and to generate the oscillation signal based on the frequency of the oscillation signal. Specifically, the digital oscillator 54 may obtain the frequency of the oscillation signal based on the number of target level in reference to a look-up table. The look-up table may store the oscillation frequencies of the oscillation signal, the length of the table may be the pre-determined number of cycles +1. If the per-determined number of cycles is relatively large, the length of the table would be longer and more time would be required for the table lookup. As a result, when designing a high-speed digital oscillator, the look-up table method would not be practical. In one embodiment, the digital oscillator 54 may calculate the frequency of the oscillator signal based on the number of target level. For example: if the number of the target level is 96, the frequency of the oscillation signal would be 76 MHz+96*100 KHz=85.6 MHz. Because there is no need for a look-up table, the storage space may be saved.

Figure 6:
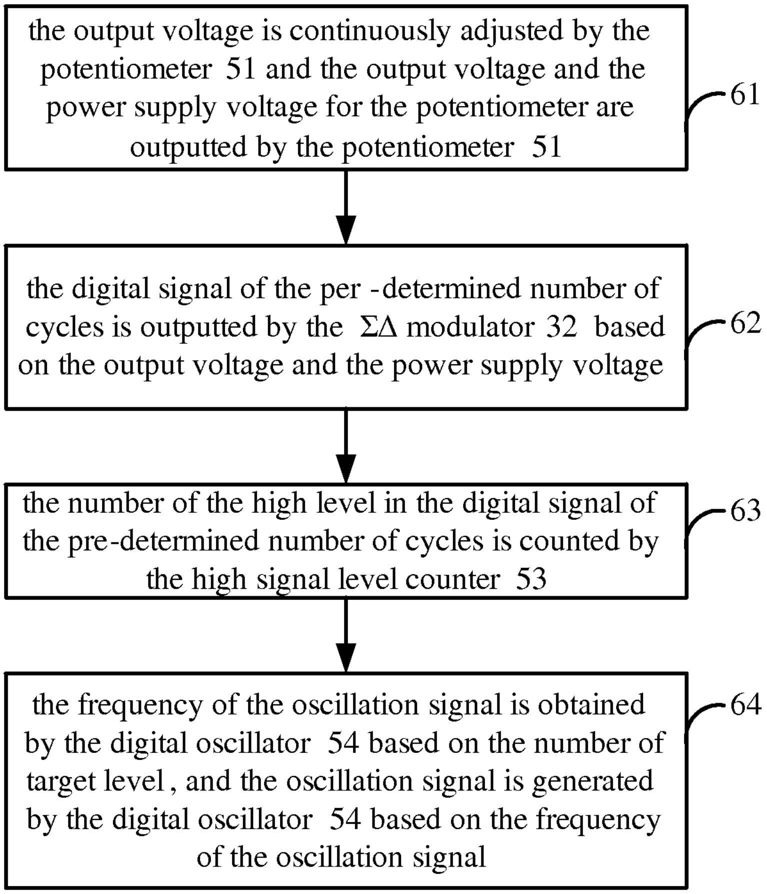
FIG. 6 is a flow chart showing a method for generating an adjustable signal by the adjustable signal generating device in FIG. 5.

FIG. 6 is a flow chart showing a method for generating an adjustable signal by the adjustable signal generating device in FIG. 5. The method may include the following steps:

In step 61, the output voltage is continuously adjusted by the potentiometer 51 and the output voltage and the power supply voltage for the potentiometer are outputted by the potentiometer 51;

In step 62, the digital signal of the per-determined number of cycles is outputted by the ΣΔ modulator 32 based on the output voltage and the power supply voltage;

In step 63, the number of the high level in the digital signal of the pre-determined number of cycles is counted by the high signal level counter 53;

In step 64, the frequency of the oscillation signal is obtained by the digital oscillator 54 based on the number of target level, and the oscillation signal is generated by the digital oscillator 54 based on the frequency of the oscillation signal.

In this embodiment, the potentiometer 51 may continuously adjust the output voltage, thus maintaining the analog adjustment method. In addition, the digital oscillator 54 may be used to generate the oscillation signal, thus avoiding the manual fine-tuning. Due to the high precision of the digital oscillator 54, the accuracy of the generated oscillation signal may be improved.

In addition, this embodiment is not sensitive to the variation of the power supply voltage. Moreover, even if the accuracy of the resistance of the resistor of the potentiometer 51 is not high, the accuracy of the generated oscillation signal would not be affected.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. An adjustable signal generating device, comprising:

a voltage generator configured to continuously adjust an output voltage and output the voltage;

a ΣΔ modulator configured to output a digital signal of a pre-determined number of cycles based on the output voltage and a reference voltage;

a counter configured to count the number of a target level in the digital signal of a pre-determined number of cycles; and a digital signal generator configured to generate a target signal based on the number of the target level.

2. The adjustable signal generating device according to claim 1, wherein said voltage generator is further configured to output a power supply voltage of said voltage generator as the reference voltage.

3. The adjustable signal generating device according to claim 2, wherein said voltage generator is a potentiometer.

4. The adjustable signal generating device according to claim 1, wherein said voltage generator is a potentiometer.

5. The adjustable signal generating device according to claim 1, wherein said counter is a high level counter to calculate the number of high level in the digital signal of a pre-determined number of cycles.

6. The adjustable signal generating device according to claim 5, wherein said digital signal generator is a digital oscillator configured to obtain a frequency of the oscillation signal based on the number of target level and generate the oscillation signal based on the frequency of the oscillation signal.

7. The adjustable signal generating device according to claim 1, wherein said digital signal generator is a digital oscillator configured to obtain a frequency of the oscillation signal based on the number of target level and generate the oscillation signal based on the frequency of the oscillation signal.

8. The adjustable signal generating device according to claim 1, wherein the pre-determined number of cycles includes a protection range and an effective range, wherein said protection range includes a first protection range and/or a second protection range with the upper limit of the first protection range being less than the lower limit of the effective range and the upper limit of the effective range being less than the lower limit of the second protection range, and the number of the target signal level is within the effective range.

9. A method for generating an adjustable signal by the adjustable signal generating device according to claim 1, comprising:

continuously adjusting an output voltage and outputting the output voltage by said voltage generator;

outputting a digital signal of a pre-determined number of cycles based on the output voltage and a reference voltage by said ΣΔ modulator;

counting the number of a target level in the digital signal of a pre-determined number of cycles by said counter; and generating a target signal based on the number of the target level by said digital signal generator.

10. The method according to claim 9 further comprising: outputting a power supply voltage of said voltage generator by said voltage generator as the reference voltage.

11. The method according to claim 10, wherein said voltage generator is a potentiometer.

12. The method according to claim 9, wherein said voltage generator is a potentiometer.

13. The method according to claim 9, wherein said counter is a high level counter; the counting the number of a target level in the digital signal of a pre-determined number of cycles by said counter is: counting the number of high level in the digital signal of a pre-determined number of cycles.

14. The method according to claim 13, wherein said digital signal generator is a digital oscillator; the generating a target signal based on the number of the target level by said digital signal generator is: obtaining a frequency of the oscillation signal based on the number of target signal level, and generating the oscillation signal based on the frequency of the oscillation signal by said digital oscillator.

15. The method according to claim 9, wherein said digital signal generator is a digital oscillator; the generating a target signal based on the number of the target level by said digital signal generator is: obtaining a frequency of the oscillation signal based on the number of target signal level, and generating the oscillation signal based on the frequency of the oscillation signal by said digital oscillator.

16. The method according to claim 9, wherein the pre-determined number of cycles includes a protection range and an effective range, wherein said protection range includes a first protection range and/or a second protection range with the upper limit of the first protection range being less than the lower limit of the effective range and the upper limit of the effective range being less than the lower limit of the second protection range, and the number of the target signal level is within the effective range.

* * * * *